United States Patent [19]

Dale

[11] 3,896,542

[45] July 29, 1975

[54] METHOD OF SEALING ELECTRICAL COMPONENT ENVELOPES

[75] Inventor: John Robert Dale, Salfords, near Redhill, England

[73] Assignee: U.S. Philips Corporation, New York, N.Y.

[22] Filed: Apr. 20, 1973

[21] Appl. No.: 352,872

[30] Foreign Application Priority Data

May 3, 1972 United Kingdom............... 20688/72

[52] U.S. Cl. .................. 228/234; 29/588; 228/246; 228/249; 228/263

[51] Int. Cl. ............................................ B23k 35/12

[58] Field of Search...................... 174/DIG. 3, 52 S; 29/470.1, 497.5, 498, 501, 588

[56] References Cited

UNITED STATES PATENTS

| | | | |
|---|---|---|---|
| 2,671,746 | 3/1954 | Brew | 29/470.1 X |
| 2,965,962 | 12/1960 | Ollendorf et al. | 29/588 X |
| 3,203,083 | 8/1965 | Obenhaus | 29/588 X |
| 3,340,602 | 9/1967 | Hontz | 29/588 |
| 3,383,454 | 5/1968 | Dix | 174/52 S |
| 3,478,416 | 11/1969 | Hamilton | 29/501 X |
| 3,543,383 | 12/1970 | Freeman et al. | 29/470.1 |
| 3,555,664 | 1/1971 | Bingham et al. | 29/470.1 |
| 3,711,939 | 1/1973 | Stoll | 29/497.5 X |
| 3,772,764 | 11/1973 | Furnival | 29/497.5 X |

*Primary Examiner*—Gerald A. Dost
*Attorney, Agent, or Firm*—Frank R. Trifari; Ronald L. Drumheller

[57] ABSTRACT

A method of sealing a metal lid on a metal peripheral wall portion of a base part of an electrical device envelope, for example an integrated circuit envelope, by pressure bonding via an intermediate malleable metal layer, for example a metal foil, at a temperature below the melting point of the layer and below the temperature at which a liquid phase would form, at a pressure of between 1 and 5 tons per square inch, and for a period not exceeding 30 seconds.

18 Claims, 4 Drawing Figures

METHOD OF SEALING ELECTRICAL COMPONENT ENVELOPES

This invention relates to methods of sealing an envelope of an electrical component, particularly but not exclusively the envelope of a semiconductor device, for example an envelope of a semiconductor integrated circuit.

In semiconductor device manufacture the encapsulation of the active semiconductor body or bodies of the device is commonly effected by (a) moulding plastic around a lead frame carrying the semiconductor body or bodies and interconnections between the lead frame and the semiconductor body or bodies, which plastic moulding defines the final shape of the encapsulation, or (b) by locating the semiconductor body on a base member part of an envelope which includes lead-in conductors to which interconnections with the so located semiconductor body or bodies are made and sealing the envelope by soldering a metal cover member on a peripheral wall portion of the base member in such a manner that a hermetic seal is obtained.

Plastic moulding is suitable for encapsulation of many semiconductor devices but in some devices the presence of the plastic material on or in the vicinity of the semiconductor body together with its relatively high porosity has a deleterious effect on the device characteristics and hence such devices have to be encapsulated in a hermetically sealed envelope. MOS integrated circuits are one example where plastic encapsulation causes problems and the requirement arises for a hermetically sealed envelope encapsulation.

The conventionally used method of soldering a metal cover member on a peripheral wall portion of a base member of the envelope usually involves the provision between the facing surfaces of a sealing ring of suitable solder material, for example of a gold/tin eutectic and the passage of the assembly through a furnace at a temperature of at least the melting point of the solder material. This method suffers from the disadvantage that the contents of the envelope, that is the active semiconductor body or bodies and the mounting and interconnections thereof on the base member, are subjected to a relatively high temperature for a substantial period of time. Furthermore it is difficult to achieve a good hermetic seal due to the occurrence of gas bubbles in the molten solder material. Another problem is that a good hermetic seal is not readily achieved if there is any slight departure from perfect flatness of the two facing surfaces.

According to the invention there is provided a method of sealing an envelope of an electrical component wherein a metal cover member of the envelope is pressure bonded on a substantially flat metal surface of a peripheral wall portion of a base member of the envelope by applying an intermediate malleable metal layer between the facing surfaces of the cover member and the wall portion and forming a mechanical bond between the cover member and the wall portion via the intermediate layer by placing the assembly of the base member, intermediate metal layer and cover member in a press under a pressure of at least 1 ton per square inch and at most 5 tons per square inch while maintaining the assembly at a temperature which is below the melting point of the intermediate metal layer and is below the temperature at which any liquid phase would form by interaction of the elemental components present at the facing surfaces, said pressure and temperature being applied for obtaining the bond for a period of not more than 30 seconds.

In this method the advantage arises that the sealing of the envelope may be carried out at significantly lower temperatures than previously used in the prior art reflow soldering methods and the period for which the contents of the envelope are subjected to an elevated temperature are considerably shorter. The temperature of bonding will be determined at least partly by the material of the intermediate malleable metal layer and by an appropriate choice of such material relatively low bonding temperatures may be achieved consistent with the obtainment of good hermetic seals. The range of pressures is chosen on the basis that for pressures in excess of 5 tons per square inch there is a risk of fracture of the members and at pressures below 1 ton per square inch it is found that the bond is not obtained or is of poor strength and does not provide a good seal. The period of at most 30 seconds at which the said pressure and temperature are applied for obtaining the bond is relatively short and may be in many applications less than 5 seconds. This short bonding time coupled with the relatively simple means required to make the bond yields a relatively cheap production process. For any particular bonding operation the period during which the said pressure and temperature are applied is such that the bond achieves a desired tensile strength which is in general approximately 50percent of the Ultimate Tensile Strength (UTS) of the malleable metal layer used. In some forms of the method where a high tensile strength bond is not required, the period during which the said temperature and pressure are applied may be such that the resultant bond has a tensile strength which is only 20 to 25 percent of the Ultimate Tensile Strength (UTS) of the malleable metal layer. When a bond strength of 50 percent of the Ultimate Tensile Strength (UTS) of the malleable metal layer is obtained, maintaining the assembly under the said pressure and temperature for a longer period will not appreciably increase the bond strength, that is it will not increase the bond strength by more than 20 percent. In the said case where the bond strength is only 20 to 25 percent of the Ultimate Tensile Strength (UTS) of the malleable metal layer, maintaining the assembly under the said pressure and temperature for a longer period will increase the bond strength but this is not desired.

The exact physical mechanism by which the bond is obtained is not fully understood. However, the temperature conditions are such that no melting occurs of the intermediate layer at the facing surfaces and no liquid phase is formed by interaction of any of the components present. Furthermore with such a short period for the bonding time no long range diffusion of the elements takes place, although some short range diffusion, that is having a depth of a few atoms, may take place. Measurements of the bond strength obtained also indicate that the bonding is not due entirely to Van der Waal forces because the bond strength is too high to be accounted for solely by said forces.

In the method in accordance with the invention it is found that the conditions of pressure and temperature are such that the deformation of the intermediate malleable metal layer is normally less than 5 percent, in many instances less than 2 percent, the deformation being the difference in thickness divided by the original thickness expressed as a percentage.

In a preferred form of the method in accordance with the invention the pressure applied lies within the range of 2.0 tons per square inch and 3.5 tons per square inch. This pressure range is effective for most of the specific materials of the intermediate malleable metal layer to be described hereinafter.

The intermediate malleable metal layer may have various different forms. In one form it consists of a metal foil and preferably such a foil has a thickness of at least 10 microns. In another form it consists of a metal coating which is applied to at least one of the facing surfaces. When the intermediate malleable metal layer consists of such a coating the choice of surface or surfaces on which it is applied and the coating thickness thereon will be determined by the materials of the cover member and the metal surface of the peripheral wall portion of the base member.

Various metals may be used for the intermediate malleable metal layer. One such metal is gold which may be employed either in the form of a foil or in the form of a coating on at least one of the facing surfaces. A preferred range of bonding temperatures using a gold intermediate layer is between 250°C and 350°C.

Another metal suitable for the intermediate metal layer is aluminum. This may be employed advantageously when the members at the facing surfaces are both of an alloy of iron, nickel and cobalt because it may not be necessary to provide any additional coating on the facing surfaces. A preferred range of bonding temperatures using an aluminum foil is between 250°C and 350°C.

The intermediate malleable metal layer may be one of a range of soft solder materials having lead as the primary constituent and melting points in the range of 300° to 327°C. One such material is of lead, silver and tin in which the percentages by weight respectively are 95, 3.5 and 1.5 and the melting point is 317°C. Another such material has the same constituents and in which the respective percentages by weight are 95.5, 3.0 and 1.5, the melting point being 306°C. With said soft solders whose primary constituent is lead a pressure of between 2.0 and 3.0 tons per square inch may be used at a temperature of between 240°C and 290°C.

The intermediate malleable metal layer may be one of a range of soft solder materials having lead and tin, cadmium and tin, lead and indium, lead-tin and silver, or lead-cadmium and tin, as constituents and having melting points in the range of 150° to 300°C. Using such materials the pressure bond may be effected at a pressure of between 2.0 and 3.0 tons per square inch and at a temperature of between 100°C and 280°C, for example when using a solder of 60 percent by weight tin and 40 percent by weight lead (melting point 183°C) or a solder of 68 percent by weight tin and 32 percent by weight cadmium (melting point 177°C) bonding may be effected at 160°C. For solder compositions of lead and indium having melting points in the range of 235° to 260°C bonding may be effected at a temperature in the range of 180° to 200°C.

Any of the above described soft solder materials may be applied as an intermediate layer in the form of a foil of at least 10 microns thickness, for example of 25 microns thickness. Alternatively such materials may be applied as coatings on at least one of the facing surfaces by dip soldering, the total thickness of such coatings being at least 10 microns and preferably at least 25 microns.

In one preferred form of the method the peripheral wall portion of the base member comprises a metal member at the facing surface. Thus the pressure bonding via the intermediate malleable metal layer is between two metal members. A commonly used metal material in semiconductor device envelopes is an alloy of iron, nickel and cobalt, for example material available commercially as KOVAR or FERNICO. This material may be used advantageously in a method in accordance with the invention and in one specific example of said preferred form the wall portion metal member and the cover member both are of an alloy of iron, nickel and cobalt and the pressure bonding is effected via an intermediate layer of gold. This gold layer may be, for example, a gold foil of 10 microns thickness and in this case the facing surfaces of the cover member and wall portion metal member are each provided with a thin gold layer.

In another example of said preferred form in which the peripheral wall portion of the base member comprises a metal member at the facing surface, the cover member and said wall portion metal member are both of an alloy of iron, nickel and cobalt and the pressure bonding of the metal cover member to the wall portion is effected via an intermediate malleable layer of a soft solder material. This solder layer may be, for example, a solder foil of 25 to 30 microns thickness and in this case the facing surfaces of the cover member and wall portion metal member are each provided with a thin gold layer.

In another preferred form of the method in accordance with the invention the peripheral wall portion of the base member comprises a glass or ceramic member having an applied surface metallization layer. The surface metallization layer may be, for example, of palladium/silver or palladium/gold.

When the intermediate malleable metal layer is in the form of a foil it may be of rectangular or circular cross-section. One advantage of using foils of circular cross-section is that slight departures from perfect flatness of either of the facing surfaces may be tolerated and a good hermetic seal can still be obtained.

Embodiments of the invention will now be described, by way of example, with reference to the accompanying diagrammatic drawings, in which.

Figure 3:
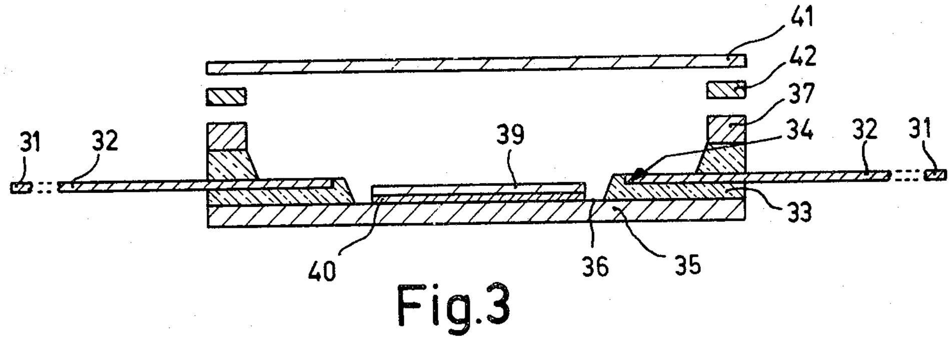
Figure 4:
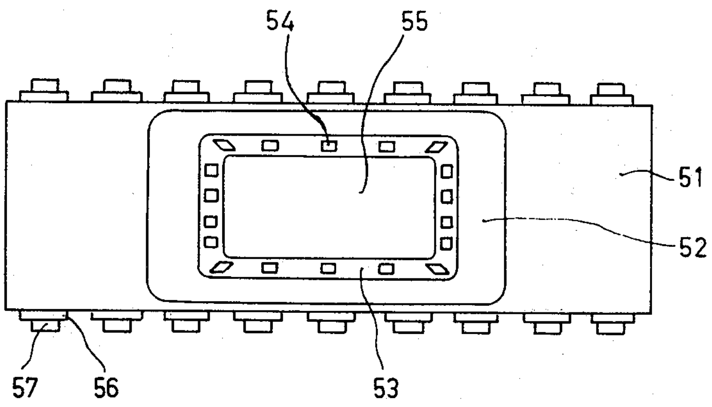

FIG. 3 shows in vertical section and in exploded form said multi-lead envelope base member including a silicon integrated circuit body mounted and connected thereon, and a cover member and soft solder foil member used in sealing the envelope by a pressure bonding method in accordance with the invention, and FIG. 4 shows in plan view a dual in-line integrated circuit envelope base member to which a cover member can be secured by a method in accordance with the invention.

Figure 1:
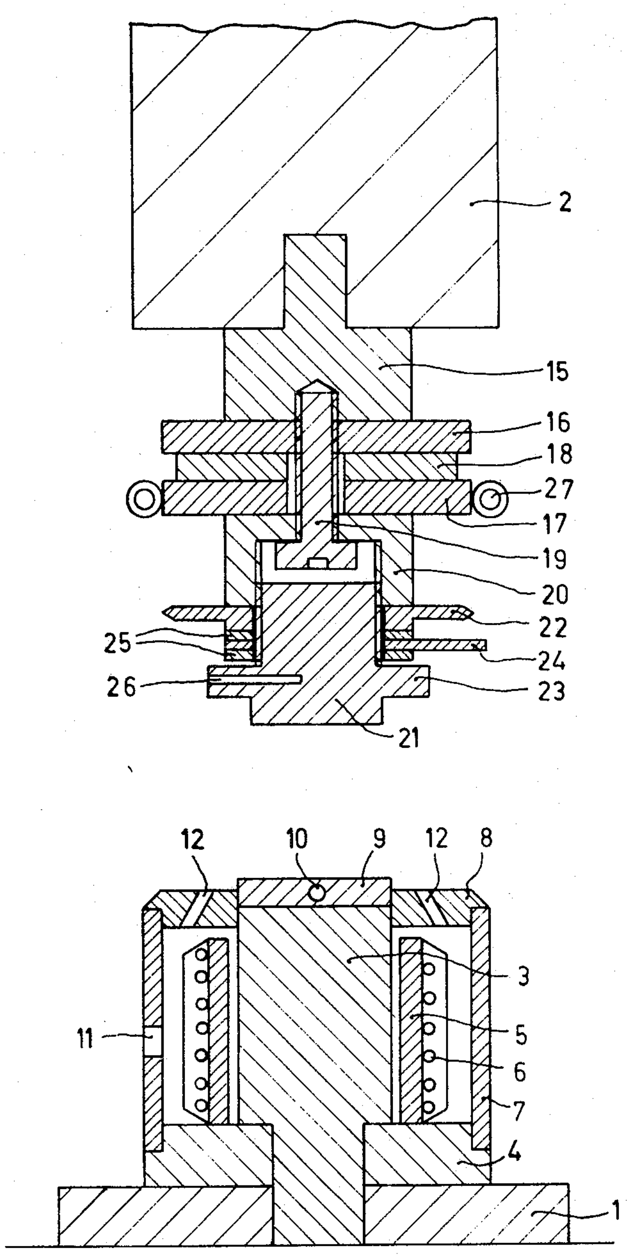
FIG. 1 is a vertical section of part of a press apparatus which may be employed in a method in accordance with the invention.

Referring first to FIG. 1, the press comprises a fixed steel supporting base 1 and a movable press head 2. A steel pedestal 3 of circular section is secured to the supporting base which also carries an asbestos support 4. On the asbestos support 4 there is a silica tube 5 which is coaxial with and surrounds the upper portion of the steel pedestal 3. A wire heater element 6 is wound around the silica tube 5. The heater element 6 and silica tube 5 are surrounded by an outer brass cover 7 which at its lower end is supported on the asbestos support 4 and at its upper end supports an asbestos cover 8. On the upper surface of the steel pedestal there is secured a steel support base 9 which is machined from material available from Kayser-Ellison as K.E. 970 tool steel which is a high duty tool steel which has been hardened and tempered. In the side of the support base 9 there is an aperture 10 for the insertion of a thermocouple (not shown). In the side wall of the outer brass cover 7 there is an opening 11 for inlet of mixed gas (10 percent hydrogen in nitrogen) to provide a controlled atmosphere around the components when being pressure bonded and to prevent oxidation of the tool faces. In the asbestos cover 12 there is a plurality of apertures for outlet of the gas.

The movable steel press head 2 has a steel insert 15 secured in its lower surface. Two steel plates 16 and 17 are secured to the insert 15 together with a rubber shock absorber pad 18 which is sandwiched between the plates 16 and 17. A bolt 19 secures the assembly of the plates 16 and 17 and the pad 18 to the insert 15, the head of the bolt 19 extending inside a steel cup member 20 which is loosely attached in the insert 15. The cup member 20 is internally threaded and locates an externally threaded end pressure plate 21 also of K.E. 970 tool steel. On the lower peripheral surface of the steel cup member 20 there is an asbestos insulator 22. The end pressure plate 21 has a peripheral rim 23 and between the rim 23 and the asbestos insulator 22 there is clamped a flat nichrome heater member 24 between two mica plates 25. The end pressure plate has an aperture 26 for insertion of a thermocouple element. The outer surface of the plate 17 has a water cooling tube attached thereto.

The operation of the press apparatus in a method in accordance with the invention will now be described. With the movable press head 2 in the position shown in FIG. 1, the gas supply and heater elements 6 and 24 are switched on and the temperatures adjusted until the steel support base 9 and the end pressure plate 21 are at the desired bonding temperature. The assembly of the two members to be secured and the intermediate malleable metal layer is placed on the surface of the steel support base 9 and the movable press head 2 is lowered so that the end pressure plate 21 bears on the upper surface of the envelope cover member. The pressure of the end pressure plate 21 is then increased gradually over a period of 5 to 10 seconds until the desired bonding pressure is obtained, for example 2.5 tons per square inch. This pressure is then maintained for the desired time, for example approximately 10 seconds, and thereafter the pressure is released by upward movement of the press head 2 and finally the assembly of the sealed envelope comprising the cover member and base member which are bonded via the intermediate malleable metal layer is removed. Generally the heater elements 6 and 24 will be controlled to maintain the support base 9 and end pressure plate at the same temperature but these temperatures may if desired be varied independently. The control obtainable is ±2°C and is achieved via thermocouples in the apertures 10 and 27 and a temperature controller. The pressure and pressure build-up is controlled via a standard needle valve control and hydraulic clutch.

Figure 2:
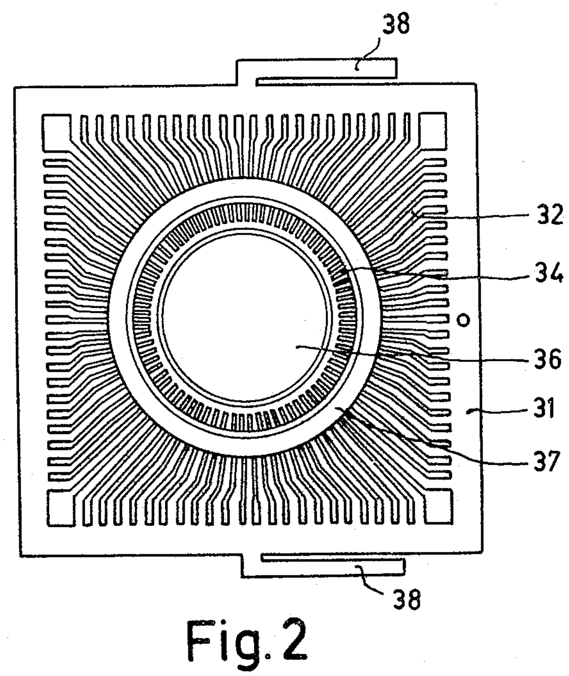
FIG. 2 is a plan view of a multi-lead envelope base member for a large scale integrated circuit.

Referrng now to FIG. 2, the multi-lead envelope base member shown comprises an outer frame member 31 of KOVAR of approximately 7.5 × 7.5 cm. from which extend 92 lead-in conductors 32. The lead-in conductors 32 pass through an annular glass wall 33 of the envelope base member and their inner ends 34 are coplanar with a ledge portion of the glass wall 33. The glass wall 33 is sealed onto a disc-shaped metal base 35 of KOVAR which together with the glass wall 33 defines part of a substantially cylindrical enclosure within which a circular part 36 of 3 cm. diameter of the inner surface of the metal base 35 is exposed. On the upper surface of the glass wall 33 there is a sealing ring 37, also of KOVAR and for use in a method of sealing the envelope in accordance with the invention. The outer frame 31, which is eventually severed from the conductors 32, has two lugs 38 for handling purposes. All the exposed KOVAR parts have a plating of gold thereon.

Referring now to FIG. 3, a silicon wafer 39 of 2.8 cm. diameter and 250 microns thickness and comprising a large scale integrated circuit is pressure bonded to the gold plated surface 36 via an intermediate foil member 40 of gold of 25 microns thickness using an apparatus as shown in FIG. 1, the pressure applied being 2.8 tons per square inch at a temperature of 300°C for a total period of 30 seconds. Prior to this bonding operation the lower surface of the silicon body is provided with a coating of gold of 1,000 A thickness on its lower surface.

Subsequently interconnections are formed between bonding pads on the upper side of the silicon wafer and the inner ends 34 of the lead-in conductors 32 by a wire bonding process conventionally employed in integrated circuit manufacture. For the sake of clarity the interconnection wires are not shown in the section of FIG. 3.

The envelope is sealed by a method in accordance with the invention. This is effected by pressure bonding a KOVAR cover member 41 in the form of a disc of 0.5 mm. thickness to the KOVAR sealing ring 37 via an intermediate gold foil ring 42 of rectangular section having a thickness of 25 microns. The KOVAR cover member 41 has a gold plating of approximately 8 microns thickness and the KOVAR sealing ring 37 also has a gold plating of approximately 8 microns thickness. The pressure bonding is effected in an apparatus as shown in FIG. 1, the pressure being 3.5 tons per square inch, the bonding temperature being 300°C and the bonding time being 10 seconds.

Another embodiment of a method in accordance with the invention will now be described with reference to FIG. 4 which shows in plan view an eighteen lead dual in-line integrated circuit envelope base member. This base member comprises a ceramic, for example, alumina base 51 of approximately 22 × 7 × 2 mm. thickness. A metal ring 52 forming a wall portion, for example of KOVAR, is brazed to the upper surface of the ceramic member 51. The ring 52 is approximately 8 × 5.5 mm. internal dimensions and of approximately 12 × 6.5 mm. external dimensions and has a thickness of approximately 1 mm. At the surface 53 of the ceramic base 51 situated inside the ring 52 the inner ends of 18 lead-in metal conductors are exposed. In a central depression in the ceramic base 51 there is a metal pad 55 for the mounting thereon of a semiconductor integrated circuit body. The eighteen lead-in metal conductors terminate at opposite side surfaces of the ceramic base 51 where conductive metal coatings 56 are present. In positions 57 of two oppositely situated metal lead frames are secured onto the coatings 56, each lead frame comprising nine pin portions. All the exposed metal parts are gold plated. In manufacture of an integrated circuit, after mounting the integrated circuit body on the metal pad 55 and making wire bonded interconnections between the inner ends 54 of the lead-in conductors and the bonding pad areas on the integrated circuit body the envelope is sealed by a method in accordance with the invention. A rectangular cover member of gold-plated KOVAR of approximately 12 × 6.5 × 0.25 mm. thickness is pressure bonded to the upper gold-plated surface of the KOVAR ring 52 via an intermediate soft solder foil of a material having lead, silver and tin as constituents, the respective percentages by weight being 93.5, 1.5 and 5.0 and the melting point being 296°C. The solder foil has surface dimensions corresponding substantially to the upper surface of the ring 52 and has a thickness of approximately 25 microns. The thickness of the gold plating on the KOVAR cover member 51 and on the upper surface of the KOVAR ring 52 is between 1 and 2 microns. The pressure bonding is carried out in an apparatus of the form as shown in FIG. 1, at a pressure of 3.0 tons per square inch, at a temperature of 280°C and for a period of between 5 and 10 seconds.

Many variations are possible within the scope of the invention. For example envelopes of different outlines to those shown in the accompanying drawings may be sealed by the pressure bonding method. Envelopes comprising glass wall portions may be sealed, for example with a cover member of an alloy of iron, nickel and cobalt, after application of suitable metallization of the upper surface of the glass wall. The choice of a soft solder material for the intermediate metal layer, for example in the form of a foil, is made in accordance with the bonding temperature required for the specific solder material and the ability of the contents of the envelope to withstand being subjected to such a temperature. The method finds particular advantage using the lower melting point soft solder materials referred to when the envelope contents are such that their subjection to elevated temperatures, for example, above 250°C, would deteriorate the electrical component characteristics.

I claim:

1. A method of forming a bond between and sealing together facing substantially flat peripheral metal surfaces of a semiconductor enclosure via an intermediate layer of malleable metal material, said bond having a bond tensile strength of approximately 20 percent or more of the Ultimate Tensile Strength of said intermediate layer, comprising the steps of:

positioning a layer of malleable metal material between said facing substantially flat peripheral metal surfaces; and pressing said facing metal surfaces together at a pressure normal to said surfaces of between 1 to 5 tons per square inch at an elevated temperature below the melting point of said malleable metal layer at said pressure and suitably close to but below the lowest temperature at which a liquid phase forms at said pressure between said malleable layer and one of said metal surfaces, said pressing being maintained at said elevated temperature for a period sufficient to achieve sealing between said facing metal surfaces and a bond having a bond tensile strength of approximately 20 percent or more of the Ultimate Tensile Strength of said malleable metal material, the maximum period required for such sealing and bonding being 30 seconds and the maximum required reduction in thickness of said malleable layer resulting therefrom being 5 percent.

2. A method as defined in claim 1 wherein said pressing at said temperature and pressure is maintained for no more than 30 seconds.

3. A method as defined in claim 2 wherein said pressing at said temperature and pressure is maintained for no more than 5 seconds.

4. A method as defined in claim 1 wherein said pressure lies within the range of 2.0 to 3.5 tons per square inch.

5. A method as defined in claim 1 wherein said layer of malleable metal material is in the form of a metal foil.

6. A method as defined in claim 1 wherein said layer is of gold and said elevated temperature maintained during said pressing step in the range of 250° to 350°C.

7. A method as defined in claim 1 wherein said layer is of aluminum and said elevated temperature maintained during said pressing step is in the range of 250° to 350°C.

8. A method as defined in claim 1 wherein said layer is of a soft solder material having lead as the primary constituent and a melting point within the range of 300° to 327°C and wherein said elevated temperature maintained during said pressing step is within the range of 240° to 290°C.

9. A method as defined in claim 1 wherein said layer is of a soft solder material having either lead and tin, cadmium and tin, lead and indium, lead-tin and silver, or lead-cadmium and tin as constituents and a melting point within the range of 150° to 300°C and wherein said elevated temperature maintained during said pressing step is within the range of 100° to 280°C.

10. A method as defined in claim 1 wherein said layer is of a soft solder material having lead and indium as constituents and a melting point within the range of 235° to 260°C and wherein said elevated temperature maintained during said pressing step is within the range of 180° to 200°C.

11. A method as defined in claim 1 wherein said layer is reduced in thickness through said pressing by no more than 5 percent.

12. A method as defined in claim 11 wherein said layer is reduced in thickness through said pressing by no more than 2 percent.

13. A method as defined in claim 1 wherein the maximum time required under said pressure and temperature for a bond tensile strength of at least 50 percent of the Ultimate Tensile Strength of said malleable metal material is 30 seconds.

14. A method as defined in claim 1 wherein the resulting bond tensile strength is at least 20 percent of the Ultimate Tensile Strength of said malleable metal material.

15. A method as defined in claim 14 wherein the resulting bond tensile strength is approximately 50 percent of the Ultimate Tensile Strength of said malleable metal material.

16. A method as defined in claim 1 wherein said facing substantially flat peripheral metal surfaces are both of an alloy of iron, nickel and cobalt.

17. A method as defined in claim 1 wherein at least one of said facing substantially flat peripheral metal surfaces is the free surface of a metal layer bonded to a glass or ceramic material.

18. A method as defined in claim 1 wherein said layer is at least 10 microns in thickness.

* * * * *